US008710732B2

(12) United States Patent
Roberts et al.

(10) Patent No.: US 8,710,732 B2
(45) Date of Patent: Apr. 29, 2014

(54) ORGANIC LIGHT EMITTING DEVICE CONNECTION METHODS

(75) Inventors: Bruce Richard Roberts, Mentor-on-the-Lake, OH (US); James Michael Kostka, East Cleveland, OH (US)

(73) Assignee: General Electric Company, Schenectady, NY (US)

( * ) Notice: Subject to any disclaimer, the term of this patent is extended or adjusted under 35 U.S.C. 154(b) by 277 days.

(21) Appl. No.: 12/644,520

(22) Filed: Dec. 22, 2009

(65) Prior Publication Data

US 2011/0147768 A1    Jun. 23, 2011

(51) Int. Cl.
*H01R 9/16*    (2006.01)
(52) U.S. Cl.
USPC ........................................ 313/504; 313/512
(58) Field of Classification Search
CPC . H05K 5/0247; H05K 5/0026; H05K 5/0043; H05K 5/0069; H01R 12/7041; H01R 12/7076; H01R 9/0735; H01R 9/0742; H01R 9/07
USPC ............ 313/498–512; 315/169.3; 345/36, 45, 345/76
See application file for complete search history.

(56) References Cited

U.S. PATENT DOCUMENTS

| 6,370,019 B1* | 4/2002 | Matthies et al. ......... 361/679.22 |
| 6,424,092 B1 | 7/2002 | Odake |
| 2004/0016568 A1 | 1/2004 | Palanisamy |

FOREIGN PATENT DOCUMENTS

EP    1469450 A1    10/2004

OTHER PUBLICATIONS

WO Search Report issued in connection with corresponding WO Patent Application No. US10/059354 filed on Dec. 8, 2010.

* cited by examiner

*Primary Examiner* — Nimeshkumar Patel
*Assistant Examiner* — Christopher Raabe
(74) *Attorney, Agent, or Firm* — Fay Sharpe LLP

(57) ABSTRACT

A light panel includes a light source having a generally planar, light emitting surface and a perimeter edge. A backsheet is disposed in substantially parallel relation with the light emitting surface, and an electrical feed-through region extends through the backsheet at a location spaced inwardly from the perimeter. A generally planar, flexible connector cable extends over the backsheet from the perimeter to the electrical feed-through region for establishing electrical connection with the light source. Openings in conductive pads provided in the flexible cable permit a conductive material to be inserted there through and mechanically and electrically interconnect the cable and the light panel.

20 Claims, 3 Drawing Sheets

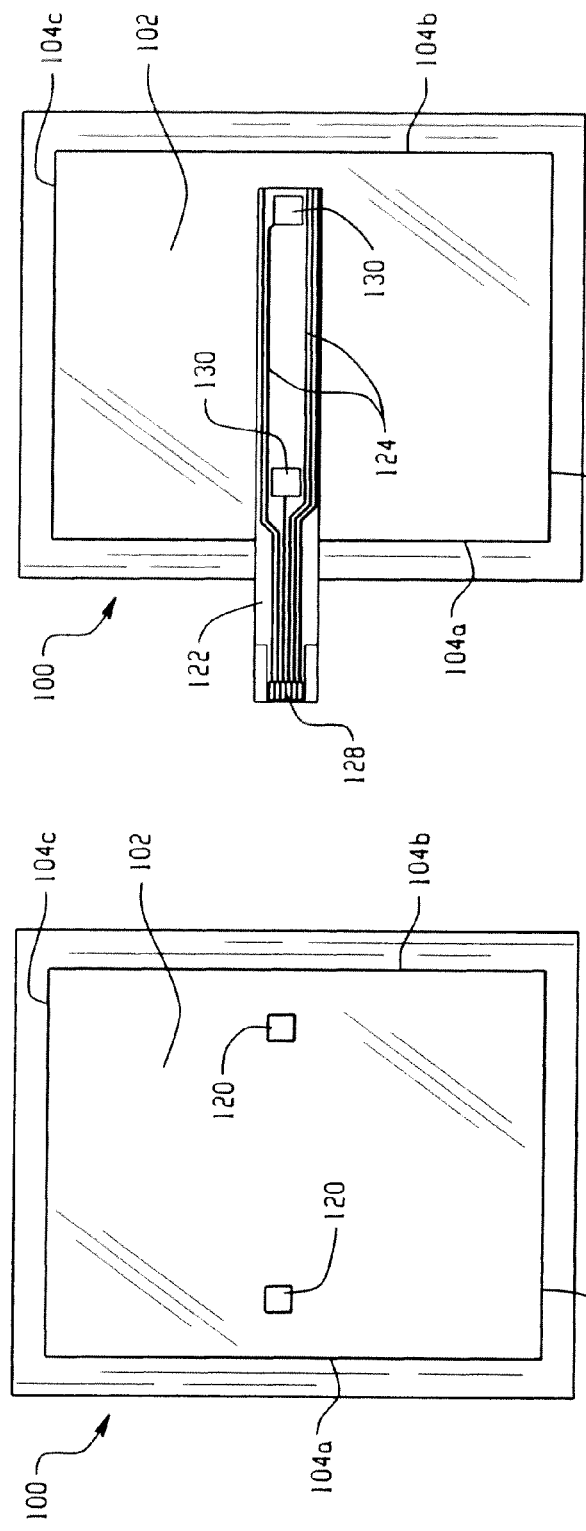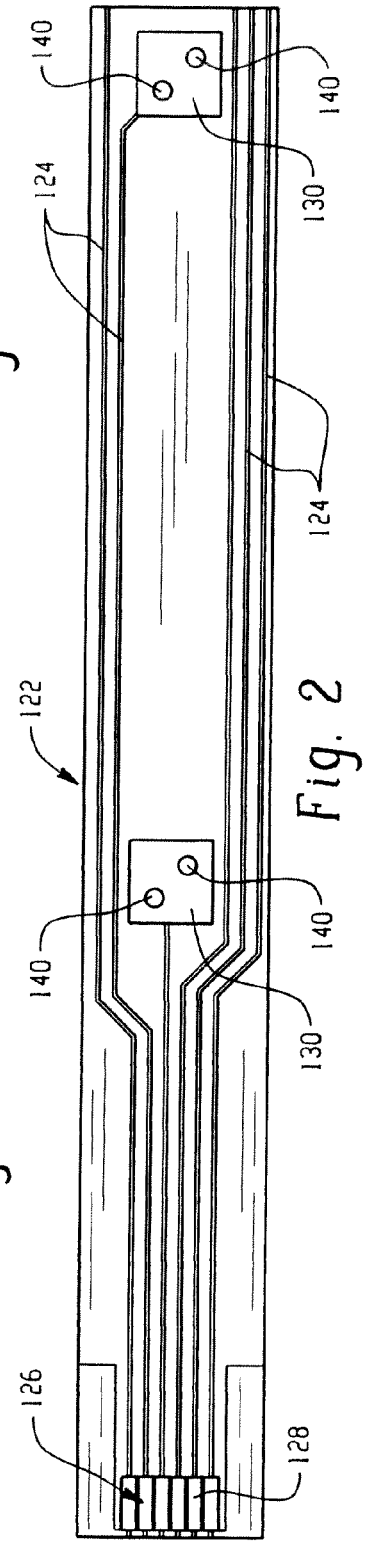

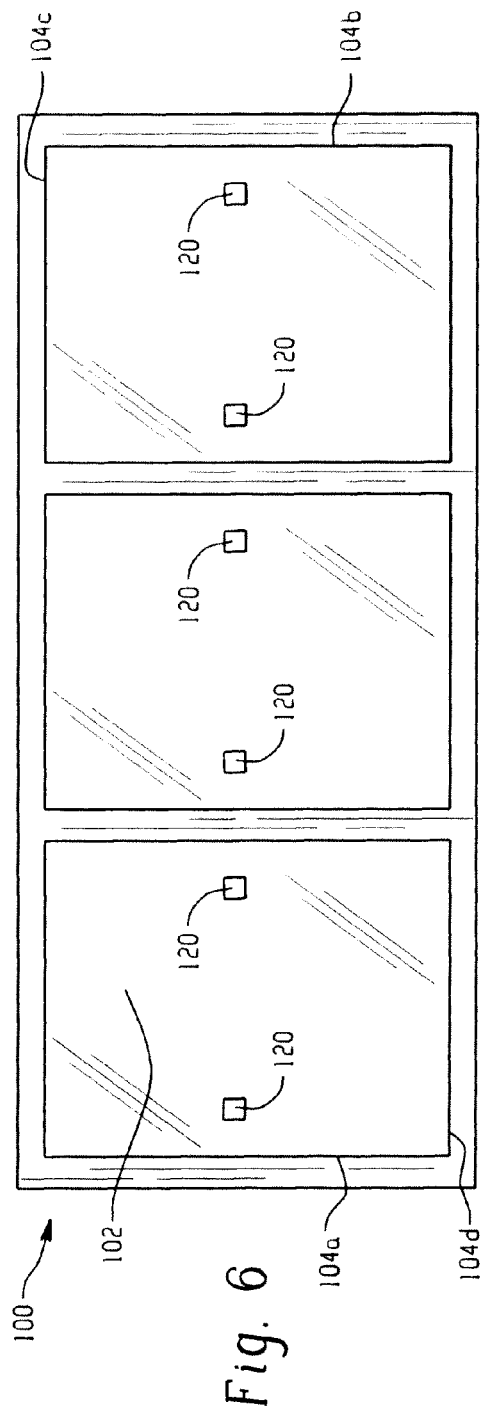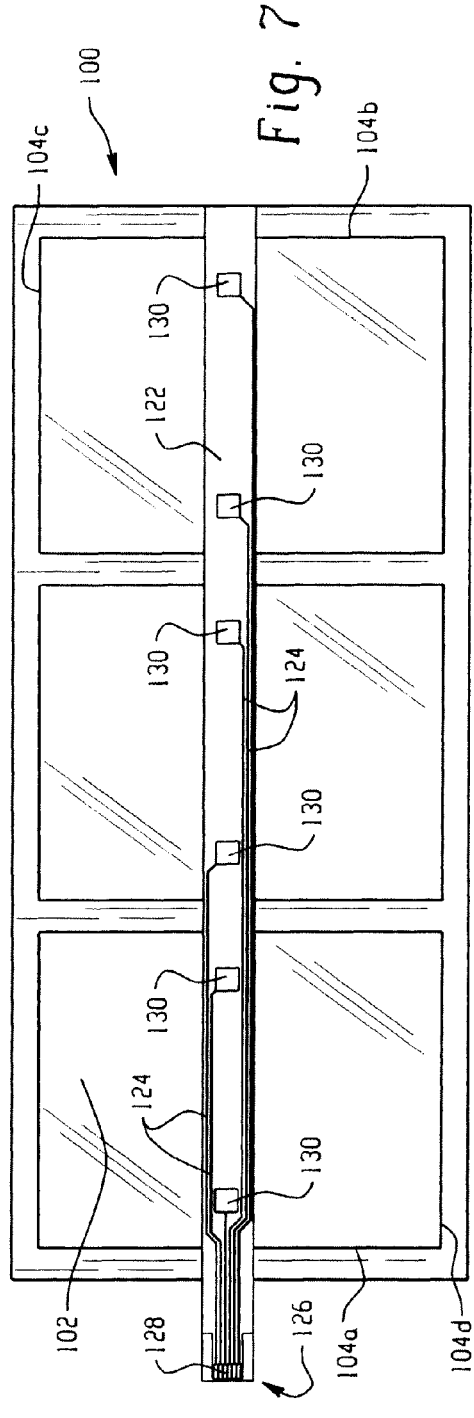

ORGANIC LIGHT EMITTING DEVICE CONNECTION METHODS

BACKGROUND OF THE DISCLOSURE

The present disclosure relates to a light source and particularly a light source connection, and more particularly to a light emitting device such as an organic light emitting diode panel and connection, as well as an associated method of electrically connecting to such a panel.

Organic light emitting diodes (OLED) devices, are generally known in the art. An OLED device typically includes one or more organic light emitting layer(s) disposed between electrodes. For example, a cathode, organic layer, and a light-transmissive anode formed on a substrate emit light when current is applied across the cathode and anode. As a result of the electric current, electrons are injected into the organic layer from the cathode and holes may be injected into the organic layer from the anode. The electrons and holes generally travel through the organic layer until they recombine at a luminescent center, typically an organic molecule or polymer. The recombination process results in the emission of a light photon usually in the ultraviolet or visible region of the electromagnetic spectrum.

The layers of an OLED are typically arranged so that the organic layers are disposed between the cathode and anode layers. As photons of light are generated and emitted, the photons move through the organic layer. Those that move toward the cathode, which generally comprises a metal, may be reflected back into the organic layer. Those photons that move through the organic layer to the light-transmissive anode, and finally to the substrate, however, may be emitted from the OLED in the form of light energy. Some cathode materials may be light transmissive, and in some embodiments light may be emitted from the cathode layer, and therefore from the OLED device in a multi-directional manner. Thus, the OLED device has at least a cathode, organic, and anode layers. Of course, additional, optional layers may or may not be included in the light source structure.

Cathodes generally comprise a material having a low work function such that a relatively small voltage causes the emission of electrons. Commonly used materials include metals, such as gold, gallium, indium, manganese, calcium, tin, lead, aluminum, silver, magnesium, lithium, strontium, barium, zinc, zirconium, samarium, europium, and mixtures or alloys of any two or more thereof. On the other hand, the anode layer is generally comprised of a material having a high work function value, and these materials are known for use in the anode layer because they are generally light transmissive. Suitable materials include, but are not limited to, transparent conductive oxides such as indium tin oxide (ITO), aluminum doped zinc oxide (AZO), fluorine doped tin oxide (FTO), indium doped zinc oxide, magnesium indium oxide, and nickel tungsten oxide; metals such as gold, aluminum, and nickel; conductive polymers such as poly(3,4-ethylenedioxythiophene) poly(styrenesulfonate) (PEDOT:PSS); and mixtures and combinations or alloys of any two or more thereof.

Preferably, these light emitting or OLED devices are generally flexible, i.e., are capable of being bent into a shape having a radius of curvature of less than about 10 cm. These light emitting devices are also preferably large-area, which means they have a dimension of an area greater than or equal to about 10 cm$^2$, and in some instances are coupled together to form a generally flexible, generally planar OLED panel comprised of one or more OLED devices, which has a large surface area of light emission.

Preferably, the panel is hermetically sealed since moisture and oxygen have an adverse impact on the OLED device. It is desired that an electrical pathway be established with the light emitting panel, and also that the electrical pathway maintain flexibility, be easily and accurately positioned, establish good electrical continuity, and maintain a thin profile.

SUMMARY OF THE DISCLOSURE

A light panel includes a light source having a generally planar light emitting surface with a perimeter edge. A backsheet is disposed in substantially parallel relation with the light emitting surface, and at least one electrical feed-through region extends through the backsheet at a location spaced inwardly of the perimeter. A generally planar connector cable extends over the backsheet from the perimeter to the electrical feed-through region for establishing electrical connection with the light source.

In one embodiment, the light emitting surface is an OLED, and the connector cable is flexible.

The backsheet may include spaced apart, plural electrical feed-through regions, and consequently the connector cable includes spaced apart, plural electrically conductive pads for establishing electrical connection with the discrete light source portions of the panel. Each of the electrically conductive pads preferably includes an opening that aids in application of a conductive adhesive, such as a silver epoxy, through the opening for establishing electrical connection with the light source.

The connector cable has a thickness preferably on the order of approximately 10 mils.

An adhesive may be interposed between the connector cable and the backsheet.

An associated method of assembling a light panel includes providing a substantially planar light source having a light emitting surface, a backsheet extending in substantially parallel relation therewith, and at least one electrical feed-through region in the backsheet located inwardly from a periphery of the substantially planar light source. Positioning a connector cable over the backsheet is a part of the assembly method so that a first portion of the connector cable extends outwardly of the light source periphery for connection with an associated drive circuit. The method further includes electrically connecting a second portion of the connector cable with the electrical feed-through region of the backsheet.

The method includes insulating conductive traces along a length of the flexible connector cable, and providing plural, spaced apart conductive pads along a surface of the connector cable for establishing electrical contact with similarly spaced electrical feed-through regions in the backsheet.

The connector cable can be temporarily secured to the backsheet while electrically connecting the conductive pads in the feed-through regions.

The electrically connecting step includes filling a feed-through region with a conductive material to establish the electrical contact between the conducting pad and the feed-through region.

The filling step includes introducing a conductive fluid material such as a conductive epoxy through one or more openings in the conductive pads, and thereafter covering the conductive pad and feed-through region with an electrical insulator.

A primary benefit is the ability to provide an effective, reliable electrical pathway for the OLED panel from a region external of the panel while maintaining flexibility.

Another advantage resides in the ability to individually address each OLED device in the panel.

Still another advantage is found in the simple, one-stage connection that connects all of the OLEDs in the panel through a zero insertion force connector.

Yet another benefit is found in the thin profile of the flat flex cable, along with the flexibility of the conductive epoxy and insulator cap that allow for conformable lighting solutions.

Openings in the conductive aluminum pad of the flat flex cable simplify manufacturing, while the flat flex cable can be initially positioned and then an adhesive applied to insure positional accuracy.

In addition to being a lower-cost method of electrically attaching to the OLED panel, this arrangement generally uniformly illuminates a large area, interconnects multiple devices, and maintains flexibility of the panel.

Still other benefits and advantages of the present disclosure will become apparent upon reading and understanding the following detailed description of the preferred embodiments.

BRIEF DESCRIPTION OF THE DRAWINGS

FIG. 1 is a plan view of a rear surface of an OLED panel.

FIG. 2 is an enlarged plan view of a preferred flat flex cable.

FIG. 3 is a plan view of the flat flex cable initially positioned or temporarily secured to the OLED panel of FIG. 1.

FIG. 6 is a plan view of the rear surface of an OLED panel assembly.

FIG. 7 is a plan view of the OLED panel assembly of FIG. 6 with the flat flex cable shown in mounted arrangement.

DETAILED DESCRIPTION OF THE PREFERRED EMBODIMENTS

Figure 4:
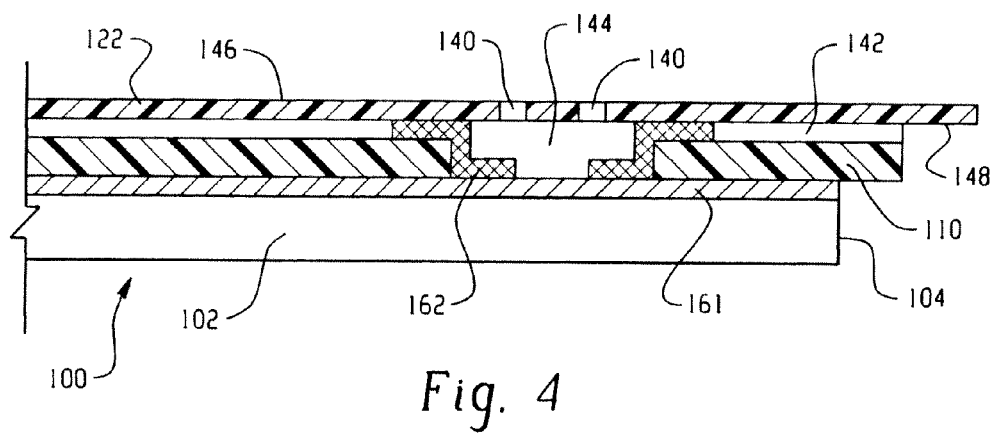
FIG. 4 is a cross-sectional view taken through a portion of the cable and OLED panel of FIG. 3.

For purposes of the following description, since the particular details of a generally planar, flexible light source or OLED device are known to those skilled in the art and previously referenced in the Background of the present application, further description herein is deemed unnecessary. Those details required for the present disclosure are provided below and illustrated in the accompanying drawings. More particularly, and with initial reference to FIGS. 1-4, a flexible light panel 100 includes a light source 102 formed at least in part by a first generally planar, light emitting surface 102 that includes a perimeter or edge 104. In the illustrated embodiment of FIGS. 1-4, the perimeter edge 104 has a generally quadrilateral conformation or rectangular conformation in which opposite edges are disposed in parallel relation. More particularly, edges 104a, 104b are parallel and edges 104c, 104d are likewise parallel. In this particular embodiment, the first and second edges 104a, 104b are substantially perpendicular to the edges 104c, 104d. Of course, the OLED panel 100 can adopt a different conformation without departing from the scope and intent of the present application.

A backsheet 110 is preferably formed from an air and moisture impervious material. The backsheet provides support for the lighting emitting surface 102 and, in one preferred embodiment, has a surface area that substantially covers one side or surface of the light source 102. It is also contemplated that the impermeable backsheet is light impermeable in this preferred embodiment also, i.e., light is emitted from the enlarged, generally planar surface 102 opposite the backsheet, but one will recognize that in other instances that the backsheet may be light transmissive and the back surface may therefore also be a light emitting surface. Perimeter edges of the light source 102 and backsheet are preferably hermetically sealed. Thus, as seen in FIGS. 1, 3, and 4, the edge of the light emitting surface 102 is sealed about its entire periphery by an extension of the backsheet. In some instances, the backsheet is co-terminus with the dimensions of the light emitting surface while in other instances the backsheet has a frame-like structure that seals about a generally annular perimeter portions. More particular details of the perimeter seal do not form a part of the present disclosure and reference may be made to commonly owned, co-pending U.S. application Ser. No. 12/691,674, filed Jan. 21, 2010, now U.S. Pat. No. 8,253,329, granted Aug. 28, 2012. More particular details on the OLED hermetic encapsulation can be found in U.S. application Ser. No. 12/470,033, filed May 21, 2009.

At selected locations in the light panel, at least one and preferably multiple electrical feed-through regions 120 (FIG. 1) are provided for communication with the individual OLED devices that constitute the light panel. These electrical feed-through regions 120 are typically spaced inwardly of the perimeter. It becomes necessary to provide an effective electrical connection with an external driver circuit (not shown). Here, a generally planar or flat, flexible cable 122 interconnects the external circuit with the feed-through regions 120. Electrically conductive traces 124 are provided in the cable and extend from a standard connector such as a zero insertion force connector 126, at or adjacent one end of the cable. The connector preferably has exposed electrically conductive portions 128. Suitable connection can be made with the external circuit (not shown) via the connector 126 and electrical current provided through the traces 124 to one or more electrically conductive pads 130 (FIG. 2) provided in the cable. As will be appreciated, the spacing between the conductive pads 130, preferably made of tin coated copper or another electrically conductive material, matches that of the dimensional spacing between the electrical feed-through regions in the backsheet of the OLED panel. These conductive pads (130) are preferably double sided (having electrical contact on both top and bottom sides) to aid in maintaining electrical continuity between the flat flex cable and the OLED device. Likewise, the cable 122 has a sufficient dimension so that the connector 126 is preferably located outside the perimeter of the OLED panel where connection can be made with the external circuit. The preferred embodiment is a connector on the outside of the perimeter of the OLED device but other examples can be noted where the connector does not extend past the outside dimension of the device but is instead electrically connected within this periphery. This type of connection method would be necessary where depth behind the OLED device is not a concern and where area outside the periphery of the OLED device is the limiting factor. Except at the exposed conductive portions 128 of the connector, and at the conductive pads 130, the conductive traces 124 are otherwise insulated from one another and from the external environment. For example, the cable can be a thin, polymer or plastic construction that serves to electrically insulate the traces from one another and from the external environment. For example, a preferred flat flexible cable has a thickness on the order of 10 mils or less so that it does not adversely interfere with the flexible nature of the OLED panel. These physical properties of the flexible cable are merely exemplary and should not be deemed limiting.

Figure 5:
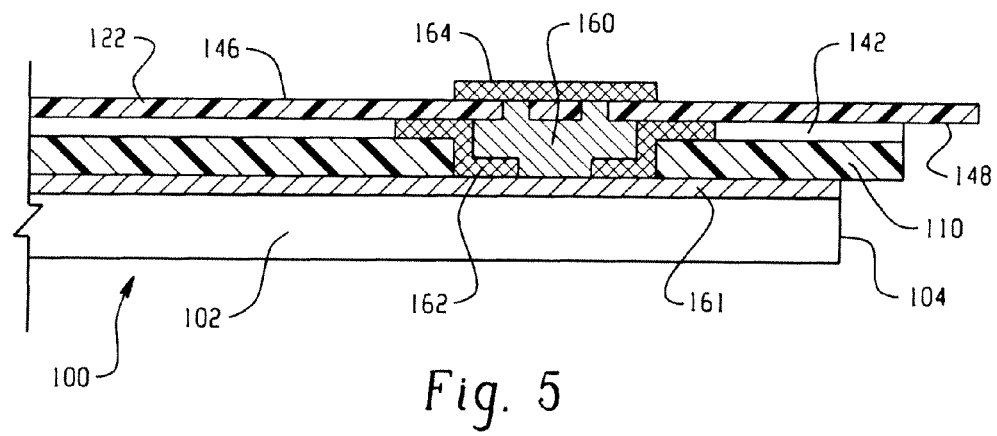
FIG. 5 is cross-sectional view similar to FIG. 4 after the electrical interconnection has been completed.

In the preferred embodiment of FIGS. 1-5, for example, the conductive pads 130 each include one or more openings 140 that extend entirely through the flexible cable. The electrical feed-through regions 120 are open or exposed to the generally planar surfaces of the flat flexible cable. In this manner, the cable 122 is positioned so that the conductive pads 130 are aligned with and overlie the feed-through regions 120 of the OLED panel. Once properly positioned or aligned as desired, the cable is held in place. For example, the cable can be temporarily held in place by an external holder, or alternatively an adhesive can be used on that surface of the flexible cable facing the OLED panel so that the flexible cable is temporarily affixed or tacked to the backsheet. Adhesive 142 is represented in FIGS. 4 and 5. Any suitable adhesive can be used, although its thickness should be minimized so as not to adversely affect the flexibility of the OLED panel and the flexible cable. It will also be appreciated that the optional adhesive can be located along other regions of the cable so that the adhesive does not interfere with the electrical connection between the pads 130 and the feed-through regions 120.

Once temporarily positioned in place as illustrated in FIGS. 3 and 4, a cavity 144 in the feed-through region 120 is then tilled from the outwardly facing surface 146 of the flexible cable (the inwardly facing surface 148 overlying and secured to the OLED panel), and the cavity subsequently filled with an electrically conductive material, for example a paste adhesive such as a flexible silver epoxy 160 (FIG. 5). The conductive material 160 substantially fills the cavity 144 and is in electrical contact with a conductive cover member 161 that is, in turn, in electrical contact with a conductive portion of the OLED device 102. Portions of the cavity 144 are lined with the insulating material 162 and otherwise the conductive material such as the silver epoxy 160 is introduced from the outwardly facing surface 146 of the flat flexible cable, through the openings 140 in the conductive pad 130 and into the cavity 144 (FIG. 4). If desired, external application of pressure can be optionally applied to temporarily hold the assembly in place and while the epoxy is cured. Moreover, and as evident in FIG. 5, insulator portion 164 overlies the silver epoxy material to allow the epoxy to cure. Likewise, the insulator can be a pressure sensitive, solvent, or UV cured material that still maintains sufficient flexibility once it is cured. As a result, the flat flexible cable 122 is effectively mechanically and electrically connected to the OLED panel, and in a manner that does not inhibit overall flexibility of the assembly. Moreover, the electrical connection can be precisely located, and yet the final assembly is effectively hermetically sealed from the external environment. Electrical continuity is created through the back of the OLED panel to the rest of the system, i.e., through the backsheet without compromising the remainder of the structure. The end connector is then a simple, one-stage connection that can be used to connect all of the individual OLED devices that comprise the panel to the rest of the electrical system. By individually addressing electrical feed-through regions 120, individual OLED devices can be individually addressed. For example, a device may need to be tuned and thus one OLED device treated differently than another OLED device in the panel.

The thin profile of the flat flexible cable, along with the flexibility of the silver epoxy and insulator cap 164 still allows the OLED panel to be adapted for use in conformable lighting solutions. The openings 140 in the aluminum pad of the flat flex cable assist in manufacture/assembly of the OLED panel. As described above, the flex cable is initially positioned on the OLED panel, the silver epoxy introduced through the openings in the conductive pads and into the feed-through region cavities, and then followed by an insulating layer. By initially or temporarily positioning the flat flex cable and then applying an adhesive, positional accuracy can be assured.

The embodiment of FIGS. 6 and 7 is substantially identical to that of FIGS. 1-5. Therefore, like elements are referenced with like reference numerals for consistency and brevity of discussion. More particularly, FIG. 6 further demonstrates that the light panel may be comprised of contiguous OLED device portions. The flat flexible cable and manner of establishing electrical continuity through a rear face of the hermetic package is particularly and advantageously illustrated here. That is, electrical feed-through regions 120 are provided in each of the OLED device portions. The flexible cable 122 includes conductive pads 130 at the same dimensional spacing as the feed-through regions. Thereafter, the mechanical and electrical interconnection is completed as described above with respect to FIGS. 1-5 and as applied to the multiple OLED device portions of FIGS. 6 and 7. In this manner, the flexible cable is able to provide electrical continuity from the external driver or circuit, along the conductive traces, to individual feed-through regions 120, and also effectively bridge hermetically sealed regions disposed between individual OLED device portions.

The disclosure has been described with respect to preferred embodiments. Obviously, modifications and alterations may be contemplated by one skilled in the art, and the subject disclosure should not be limited to the particular examples described above but instead through the following claims.

What is claimed is:

1. A light panel comprising:
    a light source having a first generally planar, light emitting surface including a perimeter edge, a backsheet disposed in substantially parallel relation with the light emitting surface, and spaced, plural electrical feedthrough regions extending through the backsheet each at a location spaced inwardly of the perimeter; and
    a single generally planar, connector cable extending over the backsheet from the perimeter to each of the electrical feedthrough regions for establishing electrical connection at each feedthrough region with the light source.

2. The light panel of claim 1 wherein the connector cable is flexible.

3. The light panel of claim 1 wherein the connector cable includes plural, spaced electrically conductive pads for establishing electrical connection with discrete light source portions.

4. The light panel of claim 1 wherein the connector cable includes a conductive trace that extends from a zero insertion force end connector, along an electrically insulated path, and communicates with an electrically conductive pad.

5. The light panel of claim 1 wherein the connector cable has a thickness on the order of approximately 10 mils.

6. The light panel of claim 1 further comprising an adhesive interposed between the cable connector and the backsheet.

7. A method of assembling a light panel comprising:
    providing a substantially planar light source having a light emitting surface, a backsheet extending in substantially parallel relation therewith, and spaced, plural electrical feedthrough regions in the backsheet each located inwardly from a periphery of the planar light source;
    positioning a single connector cable over the backsheet whereby a first portion of the connector cable extends outwardly of the light source periphery for connection with an associated drive circuit; and
    electrically connecting a second portion of the connector cable with each of the electrical feedthrough regions in the backsheet.

8. The method of claim 7 further comprising insulating conductive traces along a length of the connector cable from the first portion to the second portion.

9. The method of claim 7 further comprising providing plural, spaced conductive pads along a surface of the connector cable for establishing electrical contact with similarly spaced electrical feedthroughs in the backsheet.

10. The method of claim 9 further comprising temporarily securing the connector cable to the backsheet while electrical connecting the conductive pads and the feedthrough regions.

11. The method of claim 10 wherein the electrically connecting step includes filling a feedthrough region with a conductive material to establish the electrical contact between the conductive pad and the feedthrough region.

12. The method of claim 11 wherein the filling step includes using a conductive epoxy.

13. The method of claim 12 further comprising covering the conductive pad and feedthrough region with an electrical insulator after the filling step.

14. The method of claim 12 wherein the filling step includes applying pressure to at least one of the conductive pad and feedthrough.

15. The method of claim 9 further comprising adhesively securing the connector cable to the backsheet.

16. The method of claim 7 further comprising applying a patch over the connector cable second portion and the electrical feedthrough region after the electrically connecting step.

17. An organic light emitting diode panel comprising:
- a first substantially planar, flexible, light emitting surface formed of plural light devices and including a hermetically sealed perimeter around the light devices, a backsheet disposed in substantially parallel relation with the light emitting surface, and electrical feedthrough regions extending through the backsheet at a location spaced inwardly of the perimeter;
- a thin, generally planar, flexible single connector cable extending over the backsheet from the perimeter to each of the electrical feedthrough regions electrically connected with the light emitting surface, the connector cable including a conductive trace that is exposed only at the electrical feedthrough regions; and
- an insulator portion disposed over each electrical connection of the connector cable with the light emitting surface.

18. A method of assembling an organic light emitting diode light source comprising:
- Providing a substantially planar, flexible light source having a light emitting surface, a backsheet extending in substantially parallel relation therewith, and at least first and second electrical feedthrough regions in the backsheet located inwardly from a hermetically sealed periphery of the planar light source;
- positioning a single, thin, flexible connector cable over the backsheet whereby a first portion of the connector cable extends outwardly of the hermetically sealed periphery for connection with an associated drive circuit;
- electrically connecting a second portion of the single connector cable with the first and second electrical feedthrough regions in the backsheet, the electrically connecting step including providing an opening in the second portion of the connector cable and introducing a conductive material through the opening; and covering the connector cable second portion and the feedthrough regions with an insulator after the electrical connecting step.

19. The light panel of claim 1 wherein the single connector cable includes distinct electrically conductive linear traces extending along a length of the single conductor cable with plural conductive pads spaced apart along the length of the single conductor cable, select ones of the linear traces connected to respective select ones of the conductive pads.

20. The light panel of claim 1 wherein the conductive pads are spaced apart along the length of the single cable the same dimension as a spacing between the electrical feedthrough regions in the backsheet.

* * * * *